United States Patent
Chen et al.

(10) Patent No.: US 10,680,606 B1
(45) Date of Patent: Jun. 9, 2020

(54) TIMING CONTROL DEVICE AND METHOD FOR HIGH FREQUENCY SIGNAL SYSTEM

(71) Applicant: REALTEK SEMICONDUCTOR CORP., Hsinchu (TW)

(72) Inventors: Bo-Yu Chen, Taichung (TW); Yao-Chia Liu, Chiayi (TW); An-Ming Lee, Hsinchu County (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 0 days.

(21) Appl. No.: 16/675,311

(22) Filed: Nov. 6, 2019

(30) Foreign Application Priority Data

Mar. 6, 2019 (TW) .............................. 108107380 A

(51) Int. Cl.
*H03K 3/037* (2006.01)
*H03K 17/687* (2006.01)
*H04L 7/00* (2006.01)
*H04L 7/04* (2006.01)

(52) U.S. Cl.
CPC ......... *H03K 17/6871* (2013.01); *H03K 3/037* (2013.01); *H04L 7/0087* (2013.01); *H04L 7/042* (2013.01)

(58) Field of Classification Search
CPC .. H03K 17/6871; H03K 3/037; H04L 7/0087; H04L 7/042
See application file for complete search history.

(56) References Cited

U.S. PATENT DOCUMENTS

| | | | |
|---|---|---|---|
| 5,937,013 A * | 8/1999 | Lam ...................... | H03D 3/006 375/340 |
| 7,403,584 B2 * | 7/2008 | Koenenkamp ........ | H03L 7/0814 375/354 |
| 9,716,582 B2 * | 7/2017 | Ramezani ............. | H04L 7/0029 |
| 10,326,620 B2 * | 6/2019 | Tajalli ..................... | H04L 25/14 |

\* cited by examiner

*Primary Examiner* — Patrick O Neill
(74) *Attorney, Agent, or Firm* — Li & Cai Intellectual Property (USA) Office

(57) ABSTRACT

A timing control device and a timing control method for a high frequency signal system, the timing control method respectively control trigger points of reset signals, and process the controlled reset signals and clock signals to obtain a signal group with having an absolute timing relationship.

18 Claims, 10 Drawing Sheets

TIMING CONTROL DEVICE AND METHOD FOR HIGH FREQUENCY SIGNAL SYSTEM

CROSS-REFERENCE TO RELATED PATENT APPLICATION

This application claims the benefit of priority to Taiwan Patent Application No. 108107380, filed on Mar. 6, 2019. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a timing control device and method, and more particularly to a timing control device and method for a high frequency signal system.

BACKGROUND OF THE DISCLOSURE

In an existing High Speed Serializer/Deserializer (SERDES) system, circuits for synchronous sampling in-phase/quadrature (I/Q) signal groups under high-speed interface face challenges in aspects of layout and design.

Although an independent frequency divider can be used to separately divide in-phase/quadrature clock signals to independently control timing of the individual signals, frequency division results can yield several different results based on a reset state of the frequency divider and relationships between the in-phase/quadrature signal groups.

For example, supposing that the conventional frequency divider starts frequency division for rising edges of the clock signal. Regarding a relationship between the reset signal and the in-phase/quadrature clock signal group, if the in-phase/quadrature clock signals sequentially appear after the rising edge trigger point of the reset signal, the result of the frequency division will be maintained in a relationship where the in-phase clock signal leads the quadrature clock signal by 90 degrees. On the other hand, if the rising edge trigger point of the reset signal appears exactly between a rising edge of the in-phase clock signal and a rising edge of the quadrature clock signal, the result of the frequency division for the quadrature clock signal would lead that for the in-phase clock signal, causing the phase of the in-phase clock signal to fall behind the phase of the quadrature clock signal by 90 degrees. Such issues can cause disorders for the timing when the circuits use the results of the frequency division for the in-phase/quadrature clock signals.

Therefore, improving circuit designs to ensure a sequence of the in-phase/quadrature clock signal group and a correct sampling relationship for the clock signals, while avoiding the disorders for the timings of the in-phase/quadrature clock signal group, has become an important issue in the art.

SUMMARY OF THE DISCLOSURE

In response to the above-referenced technical inadequacies, the present disclosure provides a timing control device and a timing control method for a high frequency signal system by utilizing independent sampling and clock gating techniques to ensure a sequence of in-phase/orthogonal signal groups, so as to ensure a correct sampling relationship for clock signals.

In one aspect, the present disclosure provides a timing control device for a high frequency signal system, which includes a sampling circuit and a gating circuit. The sampling circuit is configured to receive a primary reset signal, a first clock signal, a second clock signal, a third clock signal, and a fourth clock signal, wherein each of the first clock signal, the second clock signal, the third clock signal, and the fourth clock signal has a plurality of periodic signal feature points, a phase difference of 90 degrees is provided between the first clock signal and the second clock signal, the third clock signal is an inverted signal of the first clock signal, and the fourth clock signal is an inverted signal of the second clock signal. The sampling circuit includes a pre-sampler, a first sampler, a second sampler, a third sampler, a fourth sampler, a fifth sampler, and a sixth sampler. The pre-sampler has an input end configured to receive the primary reset signal and a clock end configured to receive one of the first clock signal, the second clock signal, the third clock signal, and the fourth clock signal, the pre-sampler is configured to sample the primary reset signal to generate a pre-sampling signal, and the pre-sampling signal has a primary trigger point. The first sampler has an input end configured to receive the pre-sampling signal, and a clock end configured to receive one clock signal, with the periodic signal feature point falling 270 degrees behind the primary trigger point, of the first clock signal, the second clock signal, the third clock signal, and the fourth clock signal, and the first sampler is configured to sample the pre-sampling signal according to the periodic signal feature point to output a first pre-sampling signal having a first preset trigger point at a first output end of the first sampler. The second sampler has an input end configured to receive the first pre-sampling signal and a clock end configured to receive one clock signal, with the periodic signal feature point falling 270 degrees behind the first preset trigger point, of the first clock signal, the second clock signal, the third clock signal, and the fourth clock signal, and the second sampler is configured to sample the first pre-sampling signal according to the periodic signal feature point to output a first reset signal having a first trigger point at a first output end of the second sampler. The third sampler has an input end configured to receive the first reset signal and a clock end configured to receive one clock signal, with the periodic signal feature point falling 270 degrees behind the first trigger point, of the first clock signal, the second clock signal, the third clock signal, and the fourth clock signal, and the third sampler is configured to sample the first reset signal according to the periodic signal feature point to output a fourth reset signal having a fourth trigger point at a first output end of the third sampler. The fourth sampler has an input end configured to receive the pre-sampling signal and a clock end configured to receive one clock signal, with the periodic signal feature point falling 360 degrees behind the primary trigger point, of the first clock signal, the second clock signal, the third clock signal, and the fourth clock signal, and the fourth sampler is configured to sample the pre-sampling signal according to the periodic signal feature point to output a second pre-sampling signal having a second preset trigger point at a first output end of the fourth sampler. The fifth sampler has an input end configured to receive the second pre-sampling signal and a clock end configured to receive one clock signal, with one of the periodic signal feature points falling 270 degrees behind and being nearest to the second preset trigger point, of the first clock signal, the second clock signal, the third clock signal, and the fourth clock signal, and the fifth sampler is configured to sample the second pre-sampling signal according to the periodic signal feature point to output a second reset signal having a second trigger point at a first output end of the fifth sampler. The sixth sampler has an input end configured to receive the second pre-sampling signal, and a clock end configured to receive one clock signal, with the periodic signal feature point falling 360 degrees behind the second trigger point, of the first clock signal, the second clock signal, the third clock signal, and the fourth clock signal, and the sixth sampler is configured to sample the second pre-sampling signal according to the periodic signal feature point to output a first reset signal having a fourth trigger point at a first output end of the sixth sampler. The gating circuit includes a first switch circuit, a second switch circuit, a third switch circuit, and a fourth switch circuit. The first switch circuit has an input end configured to receive one clock signal, with the periodic signal feature point falling 180 degrees behind the first trigger point, of the first clock signal, the second clock signal, the third clock signal, and the fourth clock signal, and the first switch circuit is configured to selectively ground an output end of the first switch circuit or output a first signal through the output end of the first switch circuit according to the first reset signal. The second switch circuit has an input end configured to receive one clock signal, with the periodic signal feature point falling 180 degrees behind the second trigger point, of the first clock signal, the second clock signal, the third clock signal, and the fourth clock signal, and the second switch circuit is configured to selectively ground an output end of the second switch circuit or output a second signal through the output end of the second switch circuit according to the second reset signal. The third switch circuit has an input end configured to receive one clock signal, with the periodic signal feature point falling 180 degrees behind the third trigger point, of the first clock signal, the second clock signal, the third clock signal, and the fourth clock signal, and the third switch circuit is configured to selectively ground an output end of the third switch circuit or output a third signal through the output end of the third switch circuit according to the third reset signal. The fourth switch circuit has an input end configured to receive one clock signal, with the periodic signal feature point falling 180 degrees behind the fourth trigger point, of the first clock signal, the second clock signal, the third clock signal, and the fourth clock signal, and the fourth switch circuit is configured to selectively ground an output end of the fourth switch circuit or output a fourth signal through the output end of the fourth switch circuit according to the fourth reset signal. The first signal, the second signal, the third signal, and the fourth signal have an absolute timing relationship.

In one aspect, the present disclosure provides a timing control method for a high frequency signal system, which includes: configuring a sampling circuit to receive a primary reset signal, a first clock signal, a second clock signal, a third clock signal, and a fourth clock signal, wherein each of the first clock signal, the second clock signal, the third clock signal, and the fourth clock signal has a plurality of periodic signal feature points, a phase difference of 90 degrees is provided between the first clock signal and the second clock signal, the third clock signal is an inverted signal of the first clock signal, the fourth clock signal is an inverted signal of the second clock signal; configuring a pre-sampler of the sampling circuit to receive, by an input end of the pre-sampler, the primary reset signal, and receive, by a clock end of the pre-sampler, one of the first clock signal, the second clock signal, the third clock signal and the fourth clock signal, to sample the primary reset signal to generate a pre-sampling signal, wherein the pre-sampling signal has a primary trigger point; configuring a first sampler of the sampling circuit to receive, by an input end of the first sampler, the pre-sampling signal, and receive, by a clock end of the first sampler, one clock signal, with the periodic signal feature point falling 270 degrees behind the primary trigger point, of the first clock signal, the second clock signal, the third clock signal, and the fourth clock signal, and configuring the first sampler to sample the pre-sampling signal according to the periodic signal feature point to output a first pre-sampling signal having a first preset trigger point at a first output end of the first sampler; configuring a second sampler of the sampling circuit to receive, by an input end of the second sampler, the first pre-sampling signal, and receive, by a clock end of the second sampler, one clock signal, with the periodic signal feature point falling 270 degrees behind the first preset trigger point, of the first clock signal, the second clock signal, the third clock signal, and the fourth clock signal, to sample the first pre-sampling signal according to the periodic signal feature point to output a first reset signal having a first trigger point at a first output end of the second sampler; configuring a third sampler of the sampling circuit to receive, by an input end of the third sampler, the first reset signal, and receive, by a clock end of the third sampler, one clock signal, with the periodic signal feature point falling 270 degrees behind the first trigger point, of the first clock signal, the second clock signal, the third clock signal, and the fourth clock signal, to sample the first reset signal according to the periodic signal feature point to output a fourth reset signal having a fourth trigger point at a first output end of the third sampler; configuring a fourth sampler of the sampling circuit to receive, by an input end configured of the fourth sampler, the pre-sampling signal, and receive, by a clock end of the fourth sampler, one clock signal, with the periodic signal feature point falling 360 degrees behind the primary trigger point, of the first clock signal, the second clock signal, the third clock signal, and the fourth clock signal, to sample the pre-sampling signal according to the periodic signal feature point to output a second pre-sampling signal having a second preset trigger point at a first output end of the fourth sampler; configuring a fifth sampler of the sampling circuit to receive, by an input end of the fifth sampler, the second pre-sampling signal, and receive, by a clock end of the fifth sampler, one clock signal, with one of the periodic signal feature points falling 270 degrees behind and being nearest to the second preset trigger point, of the first clock signal, the second clock signal, the third clock signal, and the fourth clock signal, to sample the second pre-sampling signal according to the periodic signal feature point to output a second reset signal having a second trigger point at a first output end of the fifth sampler; and configuring a sixth sampler of the sampling circuit to receive, by an input end of the sixth sampler, the second pre-sampling signal, and receive, by a clock end of the sixth sampler, one clock signal, with the periodic signal feature point falling 360 degrees behind the second trigger point, of the first clock signal, the second clock signal, the third clock signal, and the fourth clock signal, to sample the second pre-sampling signal according to the periodic signal feature point to output a first reset signal having a fourth trigger point at a first output end of the sixth sampler; configuring a first switch circuit of a gating circuit to receive, by an input end of the first switch circuit, one clock signal, with the periodic signal feature point falling 180 degrees behind the first trigger point, of the first clock signal, the second clock signal, the third clock signal, and the fourth clock signal, to selectively ground an output end of the first switch circuit or output a first signal through the output end of the first switch circuit according to the first reset signal; configuring a second switch circuit of the gating circuit to receive, by an input end of the second switch circuit, one clock signal, with the periodic signal feature point falling 180 degrees behind the second trigger point, of the first clock signal, the second clock signal, the third clock signal, and the fourth clock signal, to selectively ground an output end of the second switch circuit or output a second signal through the output end of the second switch circuit according to the second reset signal; configuring a third switch circuit of the gating circuit to receive, by an input end of the third switch circuit, one clock signal, with the periodic signal feature point falling 180 degrees behind the third trigger point, of the first clock signal, the second clock signal, the third clock signal, and the fourth clock signal, to selectively ground an output end of the third switch circuit or output a third signal through the output end of the third switch circuit according to the third reset signal; and configuring a fourth switch circuit of the gating circuit to receive, by an input end of the fourth switch circuit, one clock signal, with the periodic signal feature point falling 180 degrees behind the fourth trigger point, of the first clock signal, the second clock signal, the third clock signal, and the fourth clock signal, to selectively ground an output end of the fourth switch circuit or output a fourth signal through the output end of the fourth switch circuit according to the fourth reset signal. The first signal, the second signal, the third signal, and the fourth signal have an absolute timing relationship.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
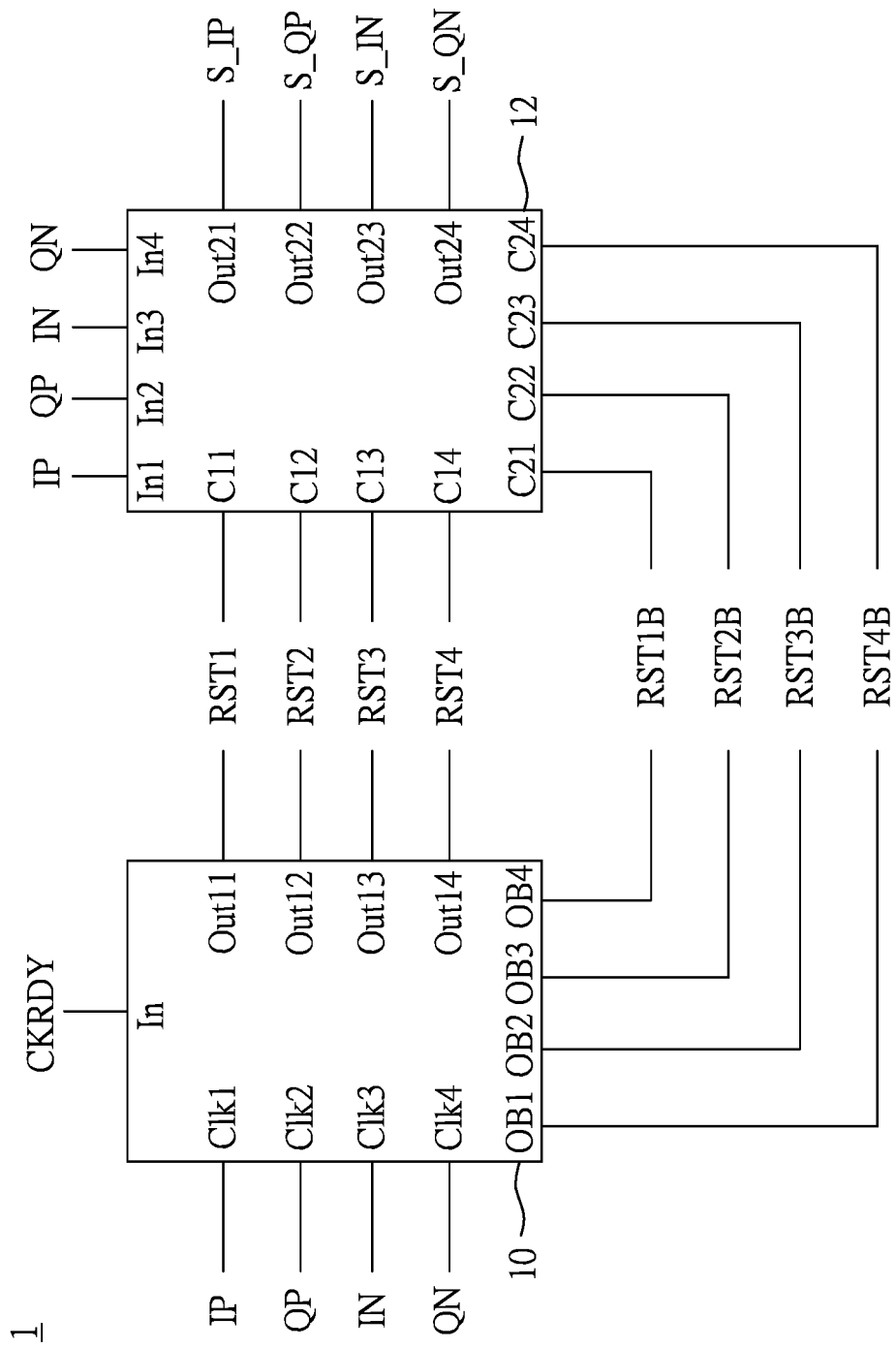
FIG. 1 is a circuit block diagram of a timing control device for a high frequency signal system according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way.

Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Reference is made to FIG. 1, which is a circuit block diagram of a timing control device for a high frequency signal system according to a first embodiment of the present disclosure. As shown in FIG. 1, a first embodiment of the present disclosure provides a timing control device 1 for a high frequency signal system, which includes a sampling circuit 10 and a gating circuit 12. As shown in FIG. 1, the sampling circuit 10 has an input end In, clock ends Clk1, Clk2, Clk3, and Clk4 for receiving a primary reset signal CKRDY, a first clock signal IP, a second clock signal QP, a third clock signal IN and a fourth clock signal QN. The sampling circuit 10 is configured to process the original primary reset signal CKRDY to be delayed with a plurality of timings, and output a first reset signal RST1, a second reset signal RST2, a third reset signal RST3 and a fourth reset signal RST4 through output ends Out11, Out12, Out13, and Out14, respectively. The sampling circuit 10 can also output inverted signals of the first reset signal RST1, the second reset signal RST2, the third reset signal RST3, and the fourth reset signal RST4 through inverted signal output ends OB1, OB2, OB3, and OB4, respectively, such as a first reset inverted signal RST1B, a second reset inverted signal RST2B, a third reset inverted signal RST3B, and a fourth reset inverted signal RST4B.

On the other hand, the gating circuit 12 has first control ends C11, C12, C13 and C14 for receiving the first reset signal RST1, the second reset signal RST2, the third reset signal RST3, and the fourth reset signal RST4, input ends In1, In2, In3, and In4 for receiving the first clock signal IP, the second clock signal QP, the third clock signal IN, and the fourth clock signal QN, and second control ends C21, C22, C23, and C24 for receiving a first inverted signal RST1B, a second reset inverted signal RST2B, a third reset inverted signal RST3B, and a fourth reset inverted signal RST4B, the gating circuit 12 can be selectively configured to, according to the first reset signal RST1, the second reset signal RST2, the third reset signal RST3, the fourth reset signal RST4, the first reset inverted signal RST1B, the second reset inverted signal RST2B, the third reset inverted signal RST3B and the fourth reset inverted signal RST4B, ground output ends Out21, Out22, Out23 and Out24 or output a first signal S_IP, a second signal S_QP, a third signal S_IN and a fourth signal S_QN.

The above descriptions are merely for the purpose of schematically explaining the architecture and corresponding functions of the timing control device of the present disclosure, and details of which will be described in detail hereinafter.

Figure 2:
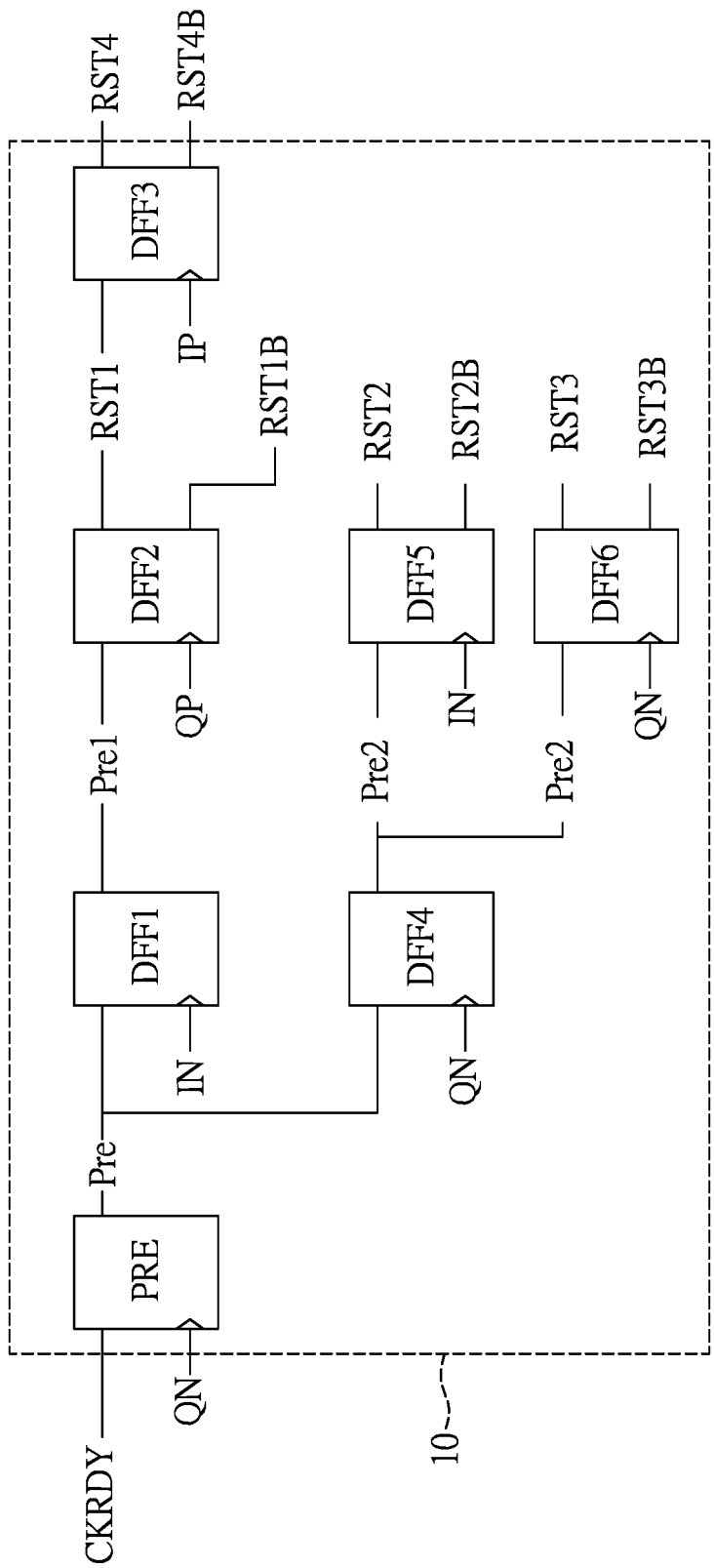
FIG. 2 is a circuit layout diagram of a sampling circuit according to the first embodiment of the present disclosure.
Figure 3:
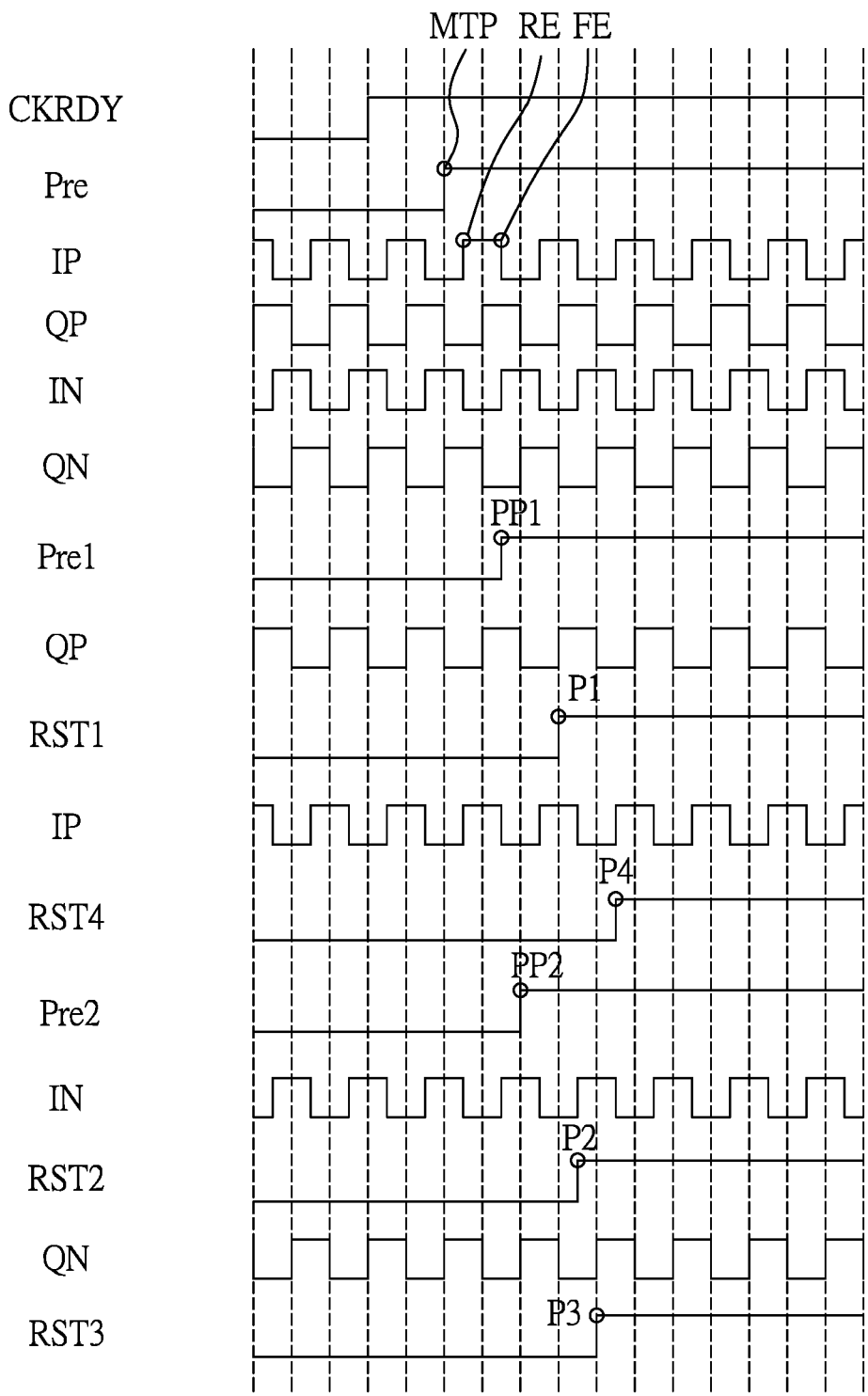
FIG. 3 is a timing chart showing signals of the sampling circuit according to the first embodiment of the present disclosure.

Reference is made to FIGS. 2 and 3, which are a circuit layout diagram of a sampling circuit and a timing chart showing signals of the sampling circuit according to the first embodiment of the present disclosure. As shown in FIGS. 2 and 3, the sampling circuit 10 is configured to receive the primary reset signal CKRDY, the first clock signal IP, the second clock signal QP, the third clock signal IN, and the fourth clock signal QN, here, the primary reset signal CKRDY has a primary trigger point MTP, and the first clock signal IP, the second clock signal QP, the third clock signal IN, and the fourth clock signal QN each has a plurality of periodic signal feature points, where the periodic signal feature points can be rising edges RE or falling edges FE. The first clock signal IP, the second clock signal QP, the third clock signal IN, and the fourth clock signal QN may be IQ data commonly used in a high frequency signal system, which display intensity changes and phase changes of sine waves. If the intensity changes and the phase changes of the sine waves are performed in orderly, predetermined manners, these intensity/phase changes can be used to encode data of the sine waves, and this process is called modulation. The modulation is to convert high frequency signals into low frequency signals according corresponding ratios. The high frequency signals are referred to as carrier signals, and the low frequency signals are referred to as message signals, information signals, or modulating signals. IQ data is not only commonly used in RF communication systems, but is also prevalent in signal modulation due to the convenience provided by the IQ data in processing modulated signals, and the detailed descriptions are omitted hereinafter.

Therefore, a phase difference between the first clock signal IP and the second clock signal QP is 90 degrees, the third clock signal IN is an inverted signal of the first clock signal IP, and the fourth clock signal QN is an inverted signal of the second clock signal QP. In this embodiment, the sampling circuit 10 may include a pre-sampler PRE, a first sampler DFF1, a second sampler DFF2, a third sampler DFF3, a fourth sampler DFF4, a fifth sampler DFF5, and a sixth sampler DFF6. Here, the first sampler DFF1, the second sampler DFF2, the third sampler DFF3, the fourth sampler DFF4, the fifth sampler DFF5, and the sixth sampler DFF6 may utilize circuits having a sampling function, for example, rising edge triggered D-Flip Flop (DFF) in the present embodiment, and a plurality of reset signals having an absolute timing relationship can be obtained after multiple sampling are performed.

Next, the pre-sampler PRE has an input end configured to receive the primary reset signal CKRDY and a clock end configured to receive one of the first clock signal IP, the second clock signal QP, the third clock signal IN, and the fourth clock signal QN, which is, in the present embodiment, the fourth clock signal QN, the pre-sampler PRE is configured to sample the primary reset signal CKRDY to generate a pre-sampling signal Pre, and the pre-sampling signal Pre has a primary trigger point MTP. Here, since a position of rising edges of the primary reset signal CKRDY are undetermined, the pre-sampler PRE can be used to generate the pre-sampling signal Pre, and a position of the primary trigger point MTP can be established by one of the first clock signal IP to the fourth clock signal QN.

The first sampler DFF1 has an input end configured to receive the pre-sampling signal Pre, and a clock end configured to receive one clock signal, with the periodic signal feature point falling 270 degrees behind the primary trigger point MTP, of the first clock signal IP, the second clock signal QP, the third clock signal IN, and the fourth clock signal PN, which is, in the present embodiment, the third clock signal IN, and a rising edge of the third clock signal IN falls 270 degree behind the primary trigger point MTP Here, the first sampler DFF1 can sample the pre-sampling signal Pre according to the rising edge to output a first pre-sampling signal Pre1 having a first preset trigger point PP1 at a first output end of the first sampler DFF1.

The second sampler DFF2 has an input end configured to receive the first pre-sampling signal Pre1, and a clock end configured to receive one clock signal, with the periodic signal feature point falling 270 degrees behind the first preset trigger point PP1, of the first clock signal IP, the second clock signal QP, the third clock signal IN, and the fourth clock signal PN, which is, in the present embodiment, the second clock signal QP, and a rising edge of the second clock signal QP falls 270 degree behind the first preset trigger point PP1. Therefore, the second sampler DFF2 can sample the first pre-sampling signal Pre1 according to the rising edge to output a first reset signal RST1 having a first trigger point P1 at a first output end of the second sampler DFF2.

The third sampler DFF3 has an input end configured to receive the first reset signal RST1, and a clock end configured to receive one clock signal, with the periodic signal feature point falling 270 degrees behind the first trigger point P1, of the first clock signal IP, the second clock signal QP, the third clock signal IN, and the fourth clock signal PN, which is, in the present embodiment, the first clock signal IP, and a rising edge of the second clock signal IP falls 270 degree behind the first trigger point P1. The third sampler DFF3 can sample the first reset signal RST1 according to the rising edge to output a fourth reset signal RST4 having a fourth trigger point P4 at a first output end of the third sampler DFF3.

The fourth sampler DFF4 has an input end configured to receive the pre-sampling signal Pre, and a clock end configured to receive one clock signal, with the periodic signal feature point falling 360 degrees behind the primary trigger point MTP, of the first clock signal IP, the second clock signal QP, the third clock signal IN, and the fourth clock signal PN. That is, in the present embodiment, the first clock signal IP, and a rising edge of the first clock signal IP falls 270 degree behind the primary trigger point MTP. The fourth sampler DFF4 can sample the pre-sampling signal Pre according to the rising edge to output a second pre-sampling signal Pre2 having a second preset trigger point PP2 at a first output end of the fourth sampler DFF4.

The fifth sampler DFF5 has an input end configured to receive the second pre-sampling signal Pre2, and a clock end configured to receive one clock signal, with the periodic signal feature point falling 270 degrees behind the second preset trigger point PP2, of the first clock signal IP, the second clock signal QP, the third clock signal IN, and the fourth clock signal PN, which is, in the present embodiment, the third clock signal IN, and a rising edge of the third clock signal IN falls 270 degree behind the second preset trigger point PP2. The fifth sampler DFF5 can sample the second pre-sampling signal Pre2 according to the rising edge to output the second reset signal RST2 having a second trigger point P1 at a first output end of the fifth sampler DFF5.

The sixth sampler DFF6 has an input end configured to receive the second pre-sampling signal Pre2, and a clock end configured to receive one clock signal, with the periodic signal feature point falling 360 degrees behind the second preset trigger point PP2, of the first clock signal IP, the second clock signal QP, the third clock signal IN, and the fourth clock signal PN, which is, in the present embodiment, the fourth clock signal QN, and a rising edge of the fourth clock signal QN falls 360 degree behind the second preset trigger point PP2. The sixth sampler DFF6 can sample the second pre-sampling signal Pre2 according to the rising edge to output the third reset signal RST3 having a third trigger point P3 at a first output end of the sixth sampler DFF6.

The second sampler DFF2, the third sampler DFF3, the fifth sampler DFF5, and the sixth sampler DFF6 are respectively configured to output a first reset inverted signal RST1B, a second reset inverted signal RST2B, a third reset inverted signal RST3B and a fourth reset inverted signal RST4B at second output ends of the second sampler DFF2, the third sampler DFF3, the fifth sampler DFF5, and the sixth sampler DFF6 to be used for subsequent control of the gating circuit 12, and the first reset inverted signal RST1B, the second reset inverted signal RST2B, the third reset inverted signal RST3B and the fourth reset inverted signal RST4B are inverted signals of the first reset signal RST1, the second reset signal RST2, the third reset signal RST3, and the fourth reset signal RST4, respectively.

In this embodiment, although the rising edges are used as the periodic signal feature points, falling edges can also be used as the periodic signal feature points in specific embodiments, and the first sampler DFF1 to the sixth sampler DFF6 can each be a falling edge triggered D-type flip-flop.

It should be noted that in each sampler, 270 degrees or 360 degrees from each of the trigger points is selected for achieving phase control with ample time margins in multiple sampling operations, while ensuring accuracy for each of the reset signals. In addition, after the original primary reset signal CKRDY is processed by the sampling circuit 10, the original primary reset signal CKRDY can be delayed as the first reset signal RST1, the second reset signal RST2, the third reset signal RST3, and the fourth reset signal RST4 having multiple timings.

Figure 4:
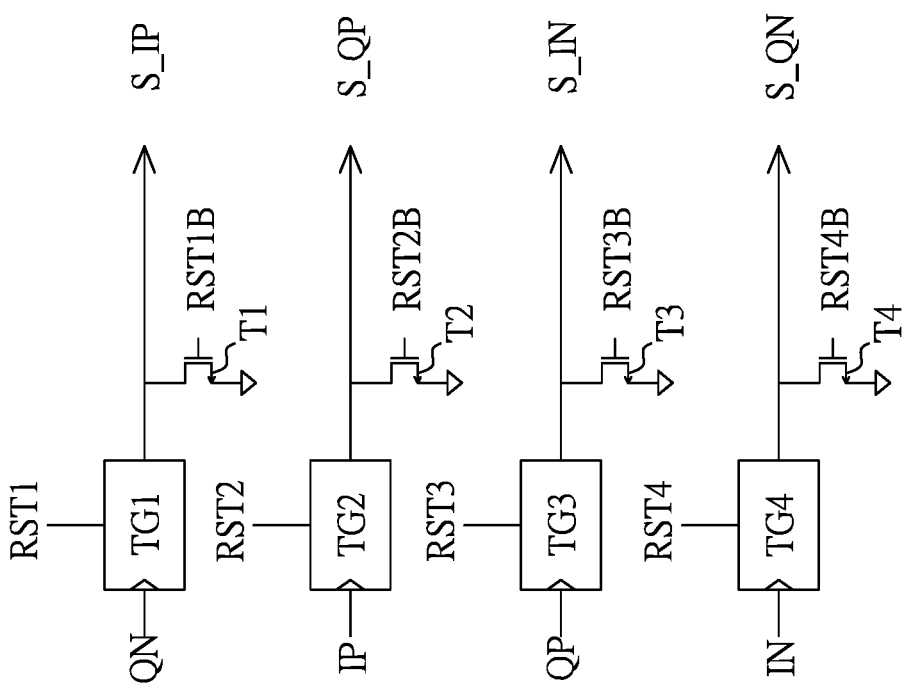
FIG. 4 is a circuit layout diagram of the first embodiment according to the present disclosure.
Figure 5:
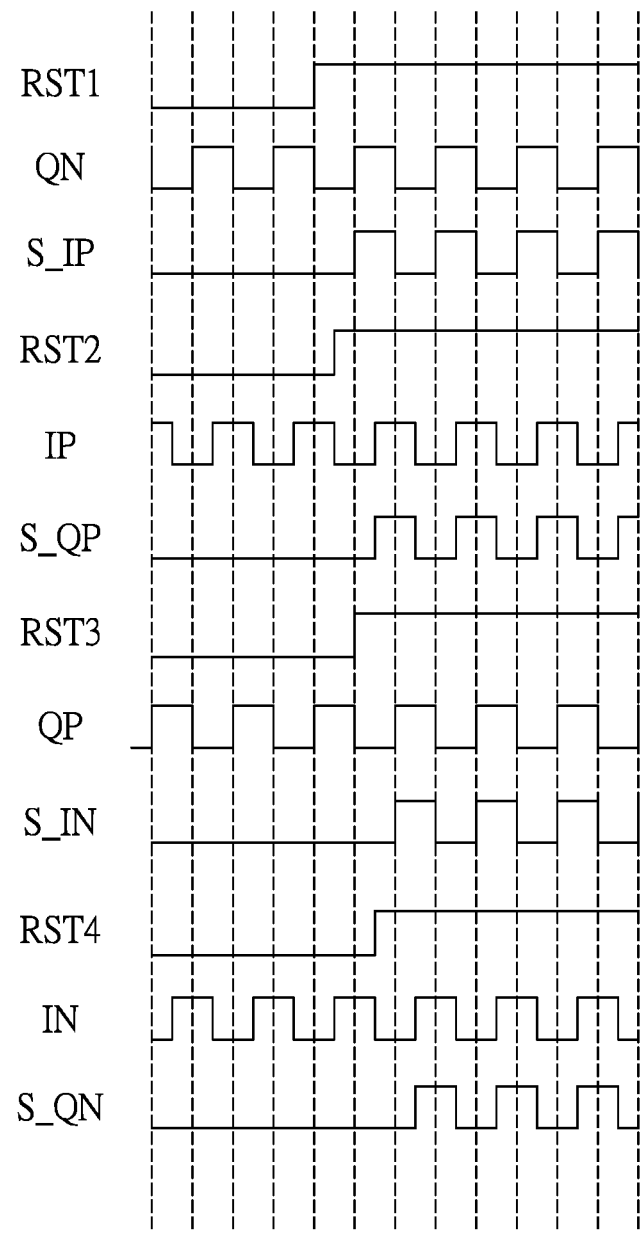
FIG. 5 is a timing chart showing signals of a gating circuit according to the first embodiment of the present disclosure.

Reference is made to FIGS. 4 and 5, which are respectively a circuit layout diagram of the gating circuit and a timing chart showing signals of a gating circuit according to the first embodiment of the present disclosure. As shown in FIGS. 4 and 5, the gating circuit 12 includes a first switch circuit TG1, a second switch circuit TG2, a third switch circuit TG3, and a fourth switch circuit TG4.

The first switch circuit TG1 has an input end configured to receive one clock signal, with the periodic signal feature point falling 180 degrees behind the first trigger point P1, of the first clock signal IP, the second clock signal QP, the third clock signal IN, and the fourth clock signal QN. That is, the fourth clock signal QN, which has a rising edge falling 180 degrees behind the first trigger point P1. The first switch circuit TG1 can be a transmission gate, and can selectively ground an output end of the first switch circuit TG1 or output a first signal S_IP through the output end of the first switch circuit TG1 according to the first reset signal RST1. In this embodiment, the output end of the first switch circuit TG1 can be connected to a ground end through a first grounding switch T1, and a control end of the first grounding switch T1 is controlled by the first reset inverted signal RST1B for forming a low level (that is, logic 0) before the first signal S_IP is triggered.

The second switch circuit TG2 has an input end configured to receive one clock signal, with the periodic signal feature point falling 180 degrees behind the second trigger point P2, of the first clock signal IP, the second clock signal QP, the third clock signal IN, and the fourth clock signal QN, that is, the first clock signal IP, which has a rising edge falling 180 degrees behind the second trigger point P2. The second switch circuit TG2 can be a transmission gate, and can selectively ground an output end of the second switch circuit TG2 or output a second signal S_QP through the output end of the first switch circuit TG1 according to the second reset signal RST2. In this embodiment, the output end of the second switch circuit TG2 can be connected to a ground end through a second grounding switch T2, and a control end of the second grounding switch T2 is controlled by the second reset inverted signal RST2B for forming a low level (that is, logic 0) before the second signal S_QP is triggered.

The third switch circuit TG3 has an input end configured to receive one clock signal, with the periodic signal feature point falling 180 degrees behind the third trigger point P3, of the first clock signal IP, the second clock signal QP, the third clock signal IN, and the fourth clock signal QN. That is, the second clock signal QP, which has a rising edge falling 180 degrees behind the third trigger point P3. The third switch circuit TG3 can be a transmission gate, and can selectively ground an output end of the third switch circuit TG3 or output a third signal S_IN through the output end of the third switch circuit TG3 according to the third reset signal RST3. In this embodiment, the output end of the third switch circuit TG3 can be connected to a ground end through a third grounding switch T3, and a control end of the third grounding switch T3 is controlled by the third reset inverted signal RST3B for forming a low level (that is, logic 0) before the third signal S_IN is triggered.

The fourth switch circuit TG4 has an input end configured to receive one clock signal, with the periodic signal feature point falling 180 degrees behind the fourth trigger point P4, of the first clock signal IP, the second clock signal QP, the third clock signal IN, and the fourth clock signal QN, that is, the third clock signal IN, which has a rising edge falling 180 degrees behind the fourth trigger point P4. The fourth switch circuit TG4 can be a transmission gate, and can selectively ground an output end of the fourth switch circuit TG4 or output a third signal S_QN through the output end of the fourth switch circuit TG4 according to the fourth reset signal RST4. In this embodiment, the output end of the fourth switch circuit TG4 can be connected to a ground end through a fourth grounding switch T4, and a control end of the fourth grounding switch T4 is controlled by the fourth reset inverted signal RST4B for forming a low level (that is, logic 0) before the fourth signal S_QN is triggered.

Therefore, the first signal S_IP, the second signal S_QP, the third signal S_IN and the fourth signal S_QN having an absolute timing relationship can be obtained accordingly. In other words, suppose the phase control device starts output after the primary trigger point MTP (the rising edge in this embodiment) of the main reset signal CKRDY, and the first signal S_IP, the second signal S_QP, the third signal S_IN and the fourth signal S_QN sequentially appear after the primary reset signal CKRDY is triggered. As shown in FIG. 5, before the leading clock signal, that is, the first signal S_IP comes, all of the clock signals are maintained at logic 0, and the second signal S_QP, the third signal S_IN and the fourth signal S_QN appear in sequence after the first signal S_IP appears, thereby ensuring that input timing relationships of signal paths are the same, and therefore the original phase relationship of the sampled signals can be maintained.

Second Embodiment

Reference is made to FIGS. 6 to 9, which are respectively a circuit layout diagram of a sampling circuit, a timing chart showing signals of the sampling circuit, a circuit layout diagram of a gating circuit and a timing chart showing signals of the gating circuit according to a second embodiment of the present disclosure.

As shown in FIGS. 6 to 9, the present embodiment differs from the first embodiment in that the timing control device 1 for a high frequency signal system further includes a surge canceling circuit 14, which has an input end configured to receive an initial reset signal ICKRDY, and a clock signal end configured to receive one of the first clock signal IP, the second clock signal QP, the third clock signal IN and the fourth clock signal QN to sample the initial reset signal ICKRDY and output the primary reset signal CKRDY at an output of the surge canceling circuit 14.

In specific embodiments, the surge cancellation circuit 14 can include a D-type flip-flop GDFF1. The D-type flip-flop GDFF1 has an input end configured to receive the initial reset signal ICKRDY and a clock signal end configured to receive one of the first clock signal IP, the second clock signal QP, the third clock signal IN and the fourth clock signal QN, for example, the second clock signal QP, to sample the initial reset signal ICKRDY according to an initial trigger point ITP of the initial reset signal ICKRDY and output the primary reset signal CKRDY at an output end of the D-type flip-flop GDFF1. Therefore, glitches of the primary reset signal CKRDY input to the pre-sampler PRE can be eliminated, and an adverse effect of the erroneous digital signal can be avoided.

Figure 6:
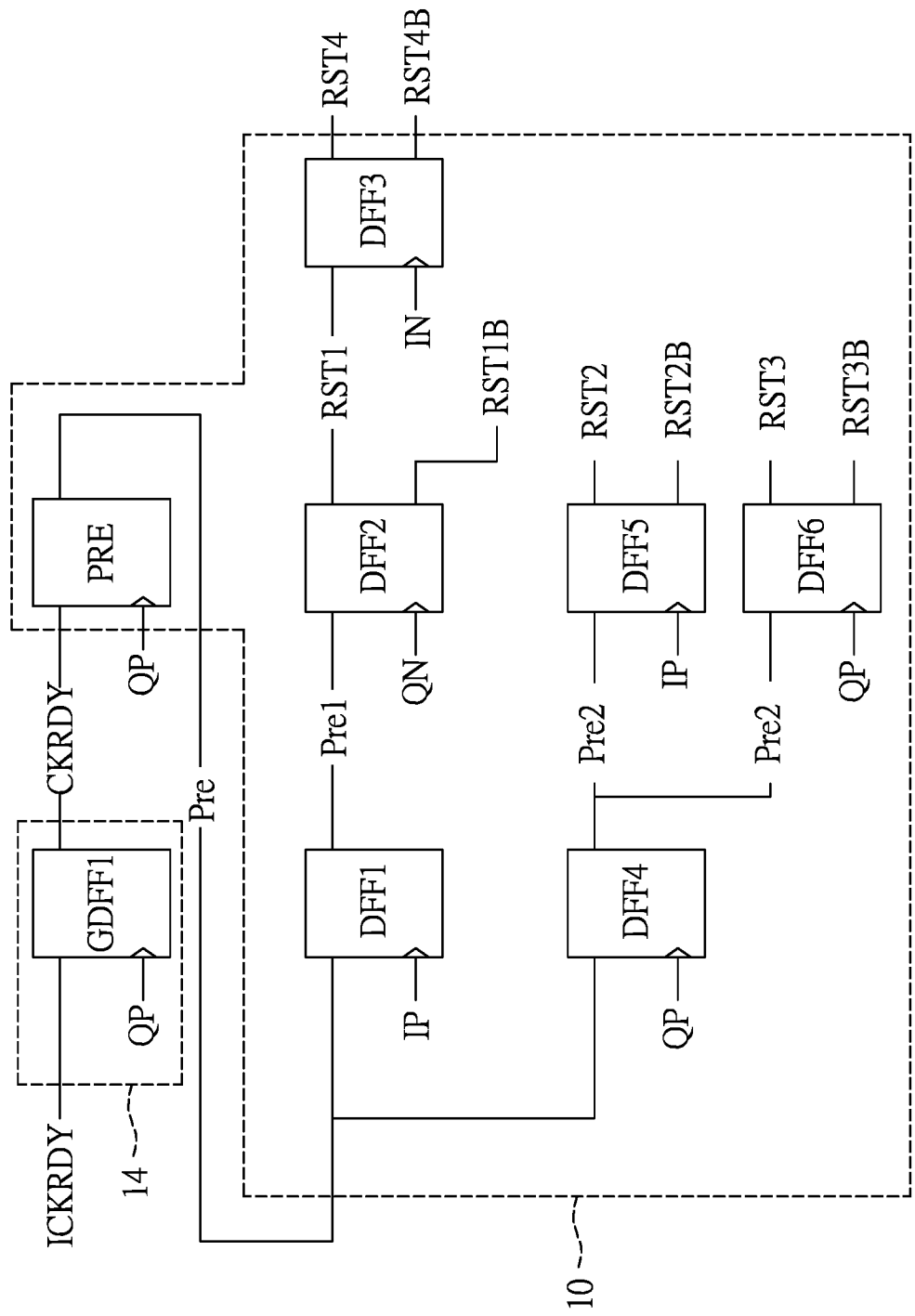
FIG. 6 is a circuit layout diagram of a sampling circuit according to a second embodiment of the present disclosure.
Figure 7:
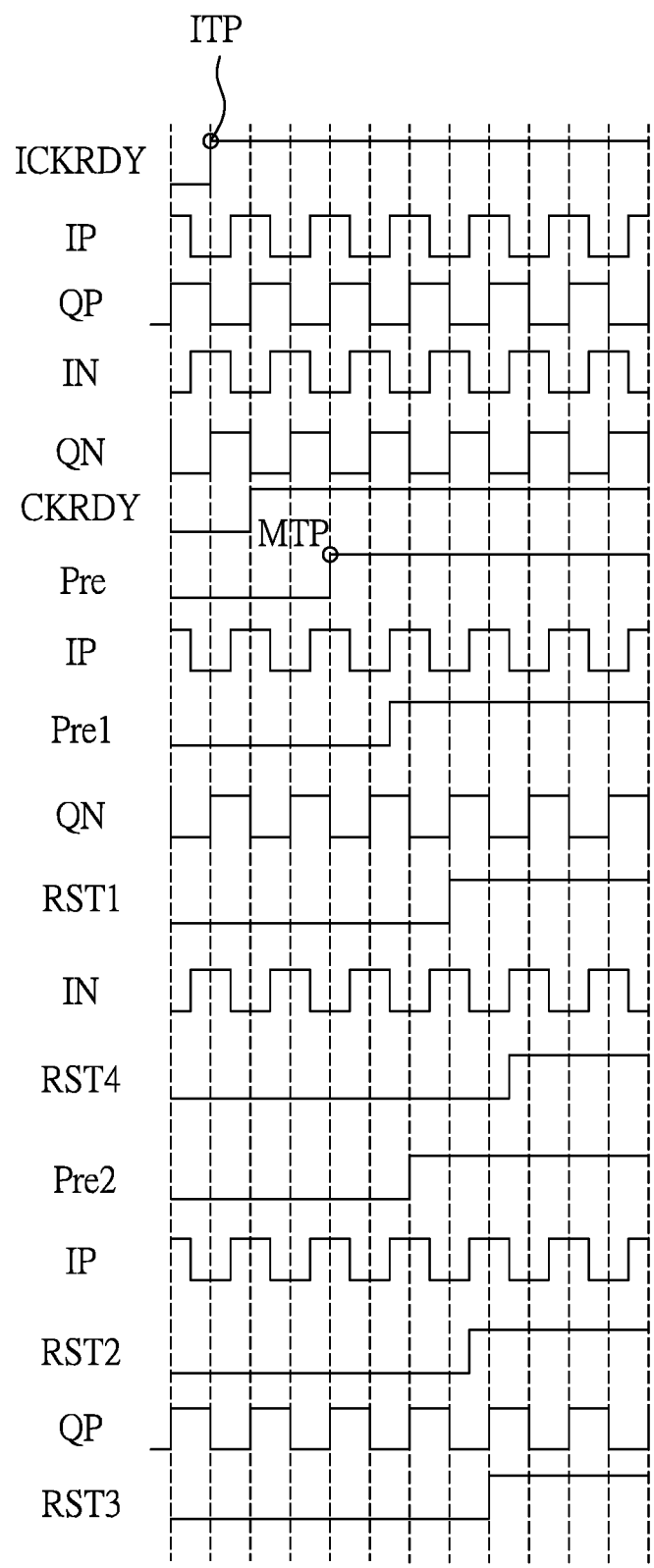
FIG. 7 is a timing chart showing signals of the sampling circuit according to the second embodiment of the present disclosure.

Here, since a phase of the new primary reset signal CKRDY is different from that of the first embodiment, the input clock signals will respectively be the first clock signals IP, the fourth clock signal QN, the third clock signal IN, the second clock signal QP, the first clock signal IP and the second clock signal QP for the first sampler DFF1 to the sixth sampler DFF6, as shown in FIGS. 6 and 7, and the new first reset signal RST1 to the fourth reset signal RST4 are generated accordingly.

Figure 8:
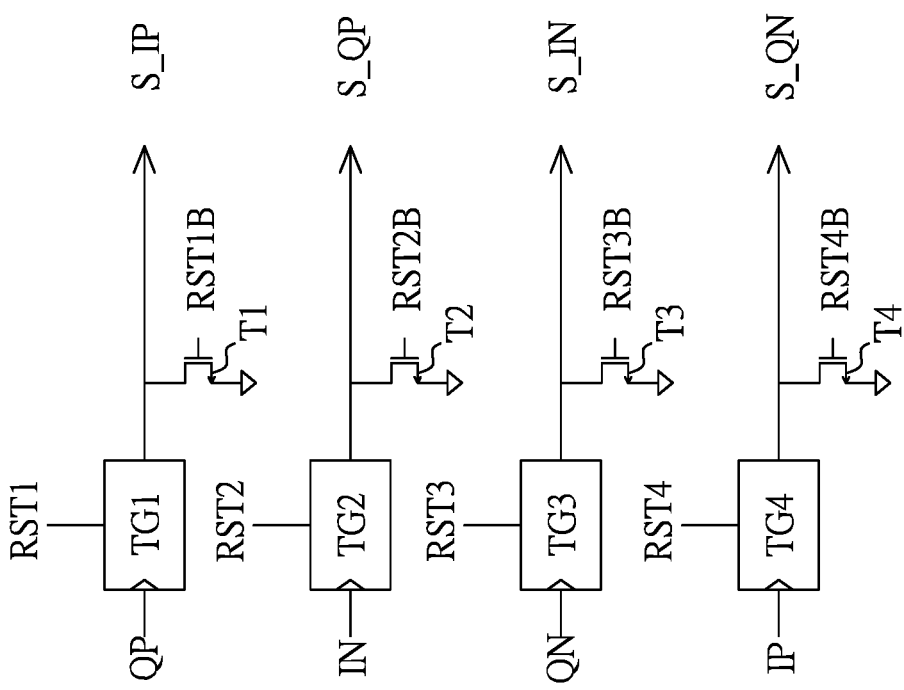
FIG. 8 is a circuit layout diagram of a gating circuit according to the second embodiment of the present disclosure.
Figure 9:
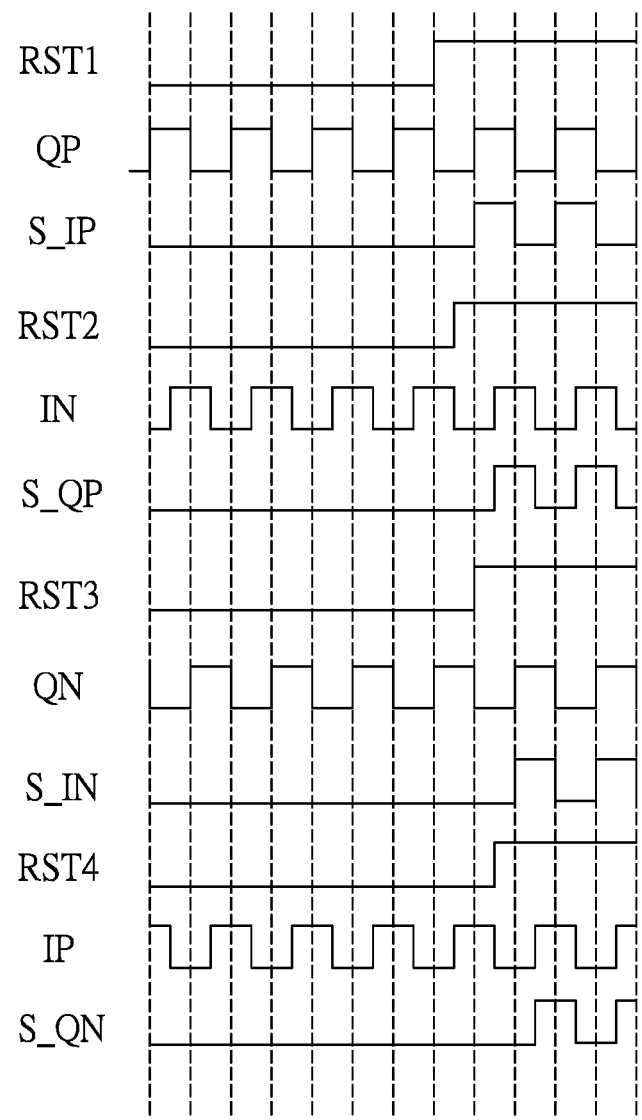
FIG. 9 is a timing chart showing signals of the gating circuit according to the second embodiment of the present disclosure.

Similarly, reference is made to FIGS. 8 and 9, since the phases of the new first reset signal RST1 to the fourth reset signal RST4 are changed, the second clock signal QP, the third clock signal IN, the fourth clock signal QN and the first clock signal IP need to be input to the first to fourth switch circuits TG1 to TG4, thereby generating the first signal S_IP to the fourth signal S_QN having an absolute timing relationship. Here, the first reset signal RST1 to the fourth reset signal RST4, and the first signal S_IP to the fourth signal S_QN are generated in a manner similar to that of the first embodiment, and thus the repeated descriptions are omitted hereinafter.

Third Embodiment

Figure 10:
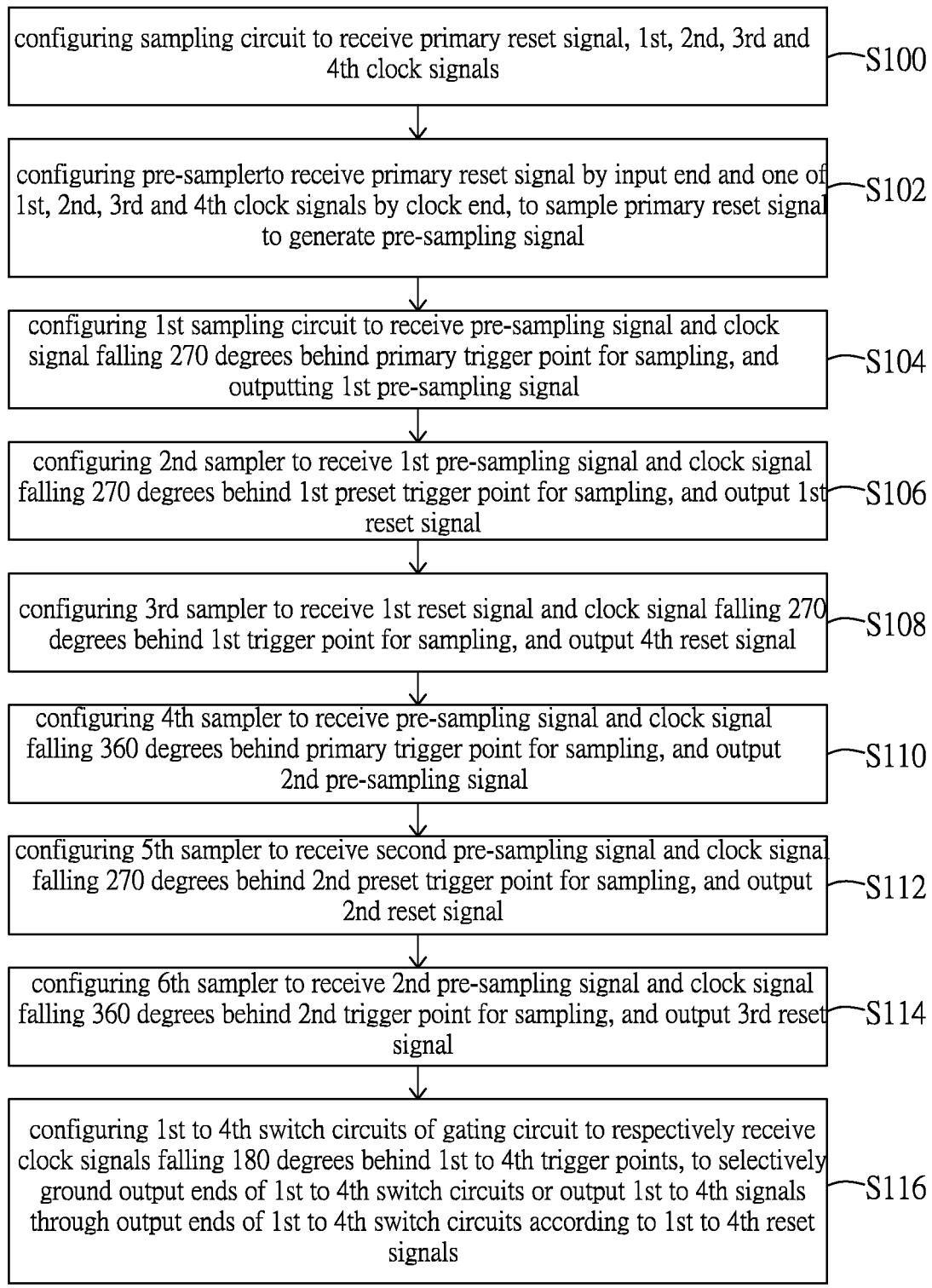
FIG. 10 is a flowchart of a timing control method for a high frequency signal system according to a third embodiment of the present disclosure.

Reference is made to FIG. 10, which is a flowchart of a timing control method for a high frequency signal system according to a third embodiment of the present disclosure.

In this embodiment, a timing control method for a high frequency signal system is further provided, which is applicable to the timing control devices of the foregoing first embodiment and the second embodiment, and since the operation details thereof are similar, and thus the repeated description are omitted.

As shown in FIG. 10, the timing control method for the high frequency signal system includes the following steps:

Step S100: configuring a sampling circuit to receive a primary reset signal, a first clock signal, a second clock signal, a third clock signal, and a fourth clock signal. Here, as depicted in the previous embodiments, the primary reset signal has a primary trigger point, each of the first clock signal, the second clock signal, the third clock signal, and the fourth clock signal has a plurality of periodic signal feature points, a phase difference of 90 degrees is provided between the first clock signal and the second clock signal, the third clock signal is an inverted signal of the first clock signal, and the fourth clock signal is an inverted signal of the second clock signal.

Step S102: configuring a pre-sampler of the sampling circuit to receive, by an input end of the pre-sampler, the primary reset signal, and receive, by a clock end of the pre-sampler, one of the first clock signal, the second clock signal, the third clock signal and the fourth clock signal, to sample the primary reset signal to generate a pre-sampling signal. In this case, the pre-sampling signal has a primary trigger point.

Step S104: configuring a first sampler of the sampling circuit to receive, by an input end of the first sampler, the pre-sampling signal, and receive, by a clock end of the first sampler, one clock signal, with the periodic signal feature point falling 270 degrees behind the primary trigger point, of the first clock signal, the second clock signal, the third clock signal, and the fourth clock signal, and configuring the first sampler to sample the pre-sampling signal according to the periodic signal feature point to output a first pre-sampling signal having a first preset trigger point at a first output end of the first sampler;

Step S106: configuring a second sampler of the sampling circuit to receive, by an input end of the second sampler, the first pre-sampling signal, and receive, by a clock end of the second sampler, one clock signal, with the periodic signal feature point falling 270 degrees behind the first preset trigger point, of the first clock signal, the second clock signal, the third clock signal, and the fourth clock signal, to sample the first pre-sampling signal according to the periodic signal feature point to output a first reset signal having a first trigger point at a first output end of the second sampler;

Step S108: configuring a third sampler of the sampling circuit to receive, by an input end of the third sampler, the first reset signal, and receive, by a clock end of the third sampler, one clock signal, with the periodic signal feature point falling 270 degrees behind the first trigger point, of the first clock signal, the second clock signal, the third clock signal, and the fourth clock signal, to sample the first reset signal according to the periodic signal feature point to output a fourth reset signal having a fourth trigger point at a first output end of the third sampler;

Step S110: configuring a fourth sampler of the sampling circuit to receive, by an input end configured of fourth sampler, the pre-sampling signal, and receive, by a clock end of the fourth sampler, one clock signal, with the periodic signal feature point falling 360 degrees behind the primary trigger point, of the first clock signal, the second clock signal, the third clock signal, and the fourth clock signal, to sample the pre-sampling signal according to the periodic signal feature point to output a second pre-sampling signal having a second preset trigger point at a first output end of the fourth sampler;

Step S112: configuring a fifth sampler of the sampling circuit to receive, by an input end of the fifth sampler, the second pre-sampling signal, and receive, by a clock end of the fifth sampler, one clock signal, with one of the periodic signal feature points falling 270 degrees behind and being nearest to the second preset trigger point, of the first clock signal, the second clock signal, the third clock signal, and the fourth clock signal, to sample the second pre-sampling signal according to the periodic signal feature point to output a second reset signal having a second trigger point at a first output end of the fifth sampler;

Step S114: configuring a sixth sampler of the sampling circuit to receive, by an input end of the sixth sampler, the second pre-sampling signal, and receive, by a clock end of the sixth sampler, one clock signal, with the periodic signal feature point falling 360 degrees behind the second trigger point, of the first clock signal, the second clock signal, the third clock signal, and the fourth clock signal, to sample the second pre-sampling signal according to the periodic signal feature point to output a first reset signal having a fourth trigger point at a first output end of the sixth sampler;

Step S116: configuring a first switch circuit, a second switch circuit, a third switch circuit and a fourth switch circuit of the gating circuit to respectively receive the clock signals falling 180 degrees behind the first trigger point, the second trigger point, the third trigger point and the fourth trigger point, to selectively ground output ends of the first switch circuit through the fourth switch circuit or output first, second, third and fourth signals through output ends of the first switch circuit, the second switch circuit, the third switch circuit and the fourth switch circuit according to the first reset signal through the fourth reset signal. For details on the particular implementation of this embodiment, the circuit layouts of the gating circuits of FIGS. 4 and 8 can be referred to, and repeated descriptions are omitted hereinafter.

In conclusion, the timing control method provided by the present disclosure selects 270 degrees or 360 degrees from each of the trigger points to be sampled in each of the samplers, for achieving phase control with ample time margins in multiple sampling operations, while ensuring accuracy for each of the reset signals.

In addition, after the original primary reset signal is processed by the sampling circuit, the original primary reset signal can be delayed as the first reset signal, the second reset signal, the third reset signal, and the fourth reset signal having multiple timings, and the gate circuit can be controlled to obtain the first signal to the fourth signal having an absolute timing relationship, accordingly. Furthermore, glitches of the primary reset signal input to the pre-sampler can be eliminated by providing the glitch cancellation circuit, and an adverse effect of the erroneous digital signal can be avoided.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated.

Alternative embodiments will become apparent to those skilled in the art to which the present disclosure pertains without departing from its spirit and scope.

What is claimed is:

1. A timing control device for a high frequency signal system, comprising:

a sampling circuit configured to receive a primary reset signal, a first clock signal, a second clock signal, a third clock signal, and a fourth clock signal, wherein each of the first clock signal, the second clock signal, the third clock signal, and the fourth clock signal has a plurality of periodic signal feature points, a phase difference of 90 degrees is provided between the first clock signal and the second clock signal, the third clock signal is an inverted signal of the first clock signal, the fourth clock signal is an inverted signal of the second clock signal, and the sampling circuit includes:

a pre-sampler having an input end configured to receive the primary reset signal and a clock end configured to receive one of the first clock signal, the second clock signal, the third clock signal, and the fourth clock signal, and configured to sample the primary reset signal to generate a pre-sampling signal, wherein the pre-sampling signal has a primary trigger point;

a first sampler having an input end configured to receive the pre-sampling signal, and a clock end configured to receive one clock signal, with the periodic signal feature point falling 270 degrees behind the primary trigger point, of the first clock signal, the second clock signal, the third clock signal, and the fourth clock signal, wherein the first sampler is configured to sample the pre-sampling signal according to the periodic signal feature point to output a first pre-sampling signal having a first preset trigger point at a first output end of the first sampler;

a second sampler having an input end configured to receive the first pre-sampling signal, and a clock end configured to receive one clock signal, with the periodic signal feature point falling 270 degrees behind the first preset trigger point, of the first clock signal, the second clock signal, the third clock signal, and the fourth clock signal, wherein the second sampler is configured to sample the first pre-sampling signal according to the periodic signal feature point to output a first reset signal having a first trigger point at a first output end of the second sampler;

a third sampler having an input end configured to receive the first reset signal, and a clock end configured to receive one clock signal, with the periodic signal feature point falling 270 degrees behind the first trigger point, of the first clock signal, the second clock signal, the third clock signal, and the fourth clock signal, wherein the third sampler is configured to sample the first reset signal according to the periodic signal feature point to output a fourth reset signal having a fourth trigger point at a first output end of the third sampler;

a fourth sampler having an input end configured to receive the pre-sampling signal, and a clock end configured to receive one clock signal, with the periodic signal feature point falling 360 degrees behind the primary trigger point, of the first clock signal, the second clock signal, the third clock signal, and the fourth clock signal, wherein the fourth sampler is configured to sample the pre-sampling signal according to the periodic signal feature point to output a second pre-sampling signal having a second preset trigger point at a first output end of the fourth sampler;

a fifth sampler having an input end configured to receive the second pre-sampling signal, and a clock end configured to receive one clock signal, with one of the periodic signal feature points falling 270 degrees behind and being nearest to the second preset trigger point, of the first clock signal, the second clock signal, the third clock signal, and the fourth clock signal, wherein the fifth sampler is configured to sample the second pre-sampling signal according to the periodic signal feature point to output a second reset signal having a second trigger point at a first output end of the fifth sampler; and a sixth sampler having an input end configured to receive the second pre-sampling signal, and a clock end configured to receive one clock signal, with the periodic signal feature point falling 360 degrees behind the second trigger point, of the first clock signal, the second clock signal, the third clock signal, and the fourth clock signal, wherein the sixth sampler is configured to sample the second pre-sampling signal according to the periodic signal feature point to output a first reset signal having a fourth trigger point at a first output end of the sixth sampler;

a gating circuit including:

a first switch circuit having an input end configured to receive one clock signal, with the periodic signal feature point falling 180 degrees behind the first trigger point, of the first clock signal, the second clock signal, the third clock signal, and the fourth clock signal, wherein the first switch circuit is configured to selectively ground an output end of the first switch circuit or output a first signal through the output end of the first switch circuit according to the first reset signal;

a second switch circuit having an input end configured to receive one clock signal, with the periodic signal feature point falling 180 degrees behind the second trigger point, of the first clock signal, the second clock signal, the third clock signal, and the fourth clock signal, wherein the second switch circuit is configured to selectively ground an output end of the second switch circuit or output a second signal through the output end of the second switch circuit according to the second reset signal;

a third switch circuit having an input end configured to receive one clock signal, with the periodic signal feature point falling 180 degrees behind the third trigger point, of the first clock signal, the second clock signal, the third clock signal, and the fourth clock signal, wherein the third switch circuit is configured to selectively ground an output end of the third switch circuit or output a third signal through the output end of the third switch circuit according to the third reset signal; and a fourth switch circuit having an input end configured to receive one clock signal, with the periodic signal feature point falling 180 degrees behind the fourth trigger point, of the first clock signal, the second clock signal, the third clock signal, and the fourth clock signal, wherein the fourth switch circuit is configured to selectively ground an output end of the fourth switch circuit or output a fourth signal through the output end of the fourth switch circuit according to the fourth reset signal, wherein the first signal, the second signal, the third signal, and the fourth signal have an absolute timing relationship.

2. The timing control device according to claim 1, further comprising a surge canceling circuit having an input end configured to receive an initial reset signal, and a clock signal end configured to receive one of the first clock signal, the second clock signal, the third clock signal and the fourth clock signal being the same as that of the pre-sampler, wherein the surge canceling circuit is configured to sample the initial reset signal and output the primary reset signal at an output of the surge canceling circuit.

3. The timing control device according to claim 2, wherein the surge canceling circuit includes a D-type flip-flop.

4. The timing control device according to claim 1, wherein the signal feature points are each a rising edge.

5. The timing control device according to claim 4, wherein the first to sixth samplers are each a rising edge triggered D-type flip-flop.

6. The timing control device according to claim 1, wherein the signal feature points are each a falling edge.

7. The timing control device according to claim 6, wherein the first to sixth samplers are each a falling edge triggered D-type flip-flop.

8. The timing control device according to claim 1, wherein the second sampler, the third sampler, the fifth sampler, and the sixth sampler are respectively configured to output a first reset inverted signal, a second reset inverted signal, a third reset inverted signal and a fourth reset inverted signal at second output ends of the second sampler, the third sampler, the fifth sampler, and the sixth sampler, wherein the first reset inverted signal, the second reset inverted signal, the third reset inverted signal and the fourth reset inverted signal are inverted signals of the first reset signal, the second reset signal, the third reset signal, and the fourth reset signal, respectively.

9. The timing control device according to claim 8, wherein the output end of the first switching circuit is connected to a ground end through a first grounding switch, and a control end of the first grounding switch is controlled by the first reset inverted signal;

wherein the output end of the second switch circuit is connected to a ground end through a second grounding switch, and a control end of the second grounding switch is controlled by the second reset inverted signal;

wherein the output end of the third switch circuit is connected to a ground end through a third grounding switch, and a control end of the third grounding switch is controlled by the third reset inverted signal; and wherein the output end of the fourth switch circuit is connected to a ground end through a fourth grounding switch, and a control end of the fourth grounding switch is controlled by the fourth reset inverted signal.

10. A timing control method for a high frequency signal system, comprising:

configuring a sampling circuit to receive a primary reset signal, a first clock signal, a second clock signal, a third clock signal, and a fourth clock signal, wherein each of the first clock signal, the second clock signal, the third clock signal, and the fourth clock signal has a plurality of periodic signal feature points, a phase difference of 90 degrees is provided between the first clock signal and the second clock signal, the third clock signal is an inverted signal of the first clock signal, and the fourth clock signal is an inverted signal of the second clock signal;

configuring a pre-sampler of the sampling circuit to receive, by an input end of the pre-sampler, the primary reset signal, and receive, by a clock end of the pre-sampler, one of the first clock signal, the second clock signal, the third clock signal and the fourth clock signal, to sample the primary reset signal to generate a pre-sampling signal, wherein the pre-sampling signal has a primary trigger point;

configuring a first sampler of the sampling circuit to receive, by an input end of the first sampler, the pre-sampling signal, and receive, by a clock end of the first sampler, one clock signal, with the periodic signal feature point falling 270 degrees behind the primary trigger point, of the first clock signal, the second clock signal, the third clock signal, and the fourth clock signal, and configuring the first sampler to sample the pre-sampling signal according to the periodic signal feature point to output a first pre-sampling signal having a first preset trigger point at a first output end of the first sampler;

configuring a second sampler of the sampling circuit to receive, by an input end of the second sampler, the first pre-sampling signal, and receive, by a clock end of the second sampler, one clock signal, with the periodic signal feature point falling 270 degrees behind the first preset trigger point, of the first clock signal, the second clock signal, the third clock signal, and the fourth clock signal, to sample the first pre-sampling signal according to the periodic signal feature point to output a first reset signal having a first trigger point at a first output end of the second sampler;

configuring a third sampler of the sampling circuit to receive, by an input end of the third sampler, the first reset signal, and receive, by a clock end of the third sampler, one clock signal, with the periodic signal feature point falling 270 degrees behind the first trigger point, of the first clock signal, the second clock signal, the third clock signal, and the fourth clock signal, to sample the first reset signal according to the periodic signal feature point to output a fourth reset signal having a fourth trigger point at a first output end of the third sampler;

configuring a fourth sampler of the sampling circuit to receive, by an input end configured of fourth sampler, the pre-sampling signal, and receive, by a clock end fourth sampler, one clock signal, with the periodic signal feature point falling 360 degrees behind the primary trigger point, of the first clock signal, the second clock signal, the third clock signal, and the fourth clock signal, to sample the pre-sampling signal according to the periodic signal feature point to output a second pre-sampling signal having a second preset trigger point at a first output end of the fourth sampler;

configuring a fifth sampler of the sampling circuit to receive, by an input end of the fifth sampler, the second pre-sampling signal, and receive, by a clock end of the fifth sampler, one clock signal, with one of the periodic signal feature points falling 270 degrees behind and being nearest to the second preset trigger point, of the first clock signal, the second clock signal, the third clock signal, and the fourth clock signal, to sample the second pre-sampling signal according to the periodic signal feature point to output a second reset signal having a second trigger point at a first output end of the fifth sampler; and configuring a sixth sampler of the sampling circuit to receive, by an input end of the sixth sampler, the second pre-sampling signal, and receive, by a clock end of the sixth sampler, one clock signal, with the periodic signal feature point falling 360 degrees behind the second trigger point, of the first clock signal, the second clock signal, the third clock signal, and the fourth clock signal, to sample the second pre-sampling signal according to the periodic signal feature point to output a first reset signal having a fourth trigger point at a first output end of the sixth sampler;

configuring a first switch circuit of a gating circuit to receive, by an input end of the first switch circuit, one clock signal, with the periodic signal feature point falling 180 degrees behind the first trigger point, of the first clock signal, the second clock signal, the third clock signal, and the fourth clock signal, to selectively ground an output end of the first switch circuit or output a first signal through the output end of the first switch circuit according to the first reset signal;

configuring a second switch circuit of the gating circuit to receive, by an input end of the second switch circuit, one clock signal, with the periodic signal feature point falling 180 degrees behind the second trigger point, of the first clock signal, the second clock signal, the third clock signal, and the fourth clock signal, to selectively ground an output end of the second switch circuit or output a second signal through the output end of the second switch circuit according to the second reset signal;

configuring a third switch circuit of the gating circuit to receive, by an input end of the third switch circuit, one clock signal, with the periodic signal feature point falling 180 degrees behind the third trigger point, of the first clock signal, the second clock signal, the third clock signal, and the fourth clock signal, to selectively ground an output end of the third switch circuit or output a third signal through the output end of the third switch circuit according to the third reset signal; and configuring a fourth switch circuit of the gating circuit to receive, by an input end of the fourth switch circuit, one clock signal, with the periodic signal feature point falling 180 degrees behind the fourth trigger point, of the first clock signal, the second clock signal, the third clock signal, and the fourth clock signal, to selectively ground an output end of the fourth switch circuit or output a fourth signal through the output end of the fourth switch circuit according to the fourth reset signal, wherein the first signal, the second signal, the third signal, and the fourth signal have an absolute timing relationship.

11. The timing control method according to claim 10, further comprising configuring a surge canceling circuit to receive, by an input end of the surge canceling circuit, an initial reset signal, and receive, by a clock signal end of the surge canceling circuit, one clock signal of the first clock signal, the second clock signal, the third clock signal and the fourth clock signal being the same as that of the pre-sampler, to sample the initial reset signal and output the primary reset signal at an output of the surge canceling circuit.

12. The timing control method according to claim 11, wherein the surge canceling circuit includes a D-type flip-flop.

13. The timing control method according to claim 10, wherein the signal feature points are each a rising edge.

14. The timing control method according to claim 13, wherein the first to sixth samplers are each a rising edge triggered D-type flip-flop.

15. The timing control method according to claim 10, wherein the signal feature points are each a falling edge.

16. The timing control method according to claim 15, wherein the first to sixth samplers are each a falling edge triggered D-type flip-flop.

17. The timing control method according to claim 10, further comprising: respectively configuring the second sampler, the third sampler, the fifth sampler, and the sixth sampler to output a first reset inverted signal, a second reset inverted signal, a third reset inverted signal and a fourth reset inverted signal at second output ends of the second sampler, the third sampler, the fifth sampler, and the sixth sampler, wherein the first reset inverted signal, the second reset inverted signal, the third reset inverted signal and the fourth reset inverted signal are inverted signals of the first reset signal, the second reset signal, the third reset signal, and the fourth reset signal, respectively.

18. The timing control method according to claim 17, further comprising:
- connecting the output end of the first switching circuit to a ground end through a first grounding switch, and controlling a control end of the first grounding switch by the first reset inverted signal;
- connecting the output end of the second switch circuit to a ground end through a second grounding switch, and controlling a control end of the second grounding switch by the second reset inverted signal;
- connecting the output end of the third switch circuit to a ground end through a third grounding switch, and controlling a control end of the third grounding switch by the third reset inverted signal; and
- connecting the output end of the fourth switch circuit to a ground end through a fourth grounding switch, and controlling a control end of the fourth grounding switch by the fourth reset inverted signal.

* * * * *